(12) United States Patent
Hocevar

(10) Patent No.: US 8,381,079 B2
(45) Date of Patent: Feb. 19, 2013

(54) SIMPLIFIED LDPC ENCODING FOR DIGITAL COMMUNICATIONS

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1150 days.

(21) Appl. No.: 12/258,575

(22) Filed: Oct. 27, 2008

(65) Prior Publication Data

US 2009/0049363 A1  Feb. 19, 2009

Related U.S. Application Data

(62) Division of application No. 11/201,391, filed on Aug. 10, 2005, now Pat. No. 7,506,238.

(60) Provisional application No. 60/601,602, filed on Aug. 13, 2004, provisional application No. 60/703,920, filed on Jul. 29, 2005.

(51) Int. Cl.
*H03M 13/00* (2006.01)
(52) U.S. Cl. .......................... 714/781; 714/758
(58) Field of Classification Search .................. 714/781, 714/758
See application file for complete search history.

(56) References Cited

U.S. PATENT DOCUMENTS

| | | | |
|---|---|---|---|
| 6,757,122 B1 * | 6/2004 | Kuznetsov et al. | 360/53 |
| 6,957,375 B2 * | 10/2005 | Richardson | 714/752 |
| 6,961,888 B2 * | 11/2005 | Jin et al. | 714/752 |
| 7,000,168 B2 * | 2/2006 | Kurtas et al. | 714/755 |
| 7,058,873 B2 * | 6/2006 | Song et al. | 714/752 |
| 7,162,684 B2 * | 1/2007 | Hocevar | 714/800 |
| 7,178,082 B2 * | 2/2007 | Yu et al. | 714/752 |
| 7,178,085 B2 * | 2/2007 | Chae et al. | 714/758 |
| 7,325,183 B2 * | 1/2008 | Deolalikar | 714/777 |
| 2003/0033570 A1 * | 2/2003 | Khannanov et al. | 714/755 |

* cited by examiner

*Primary Examiner* — Joseph D Torres
(74) *Attorney, Agent, or Firm* — Steven A. Shaw; W. James Brady; Frederick J. Telecky, Jr.

(57) ABSTRACT

Encoder circuitry for applying a low-density parity check (LDPC) code to information words is disclosed. The encoder circuitry takes advantage of a macro matrix arrangement of the LDPC parity check matrix in which the parity portion of the parity check matrix is arranged as a macro matrix in which all block columns but one define a recursion path. The parity check matrix is factored so that the last block column of the parity portion includes an invertible cyclic matrix as its entry in a selected block row, with all other parity portion columns in that selected block row being zero-valued, thus permitting solution of the parity bits for that block column from the information portion of the parity check matrix and the information word to be encoded. Solution of the other parity bits can then be readily performed, from the original (non-factored) parity portion of the parity check matrix, following the recursion path.

18 Claims, 5 Drawing Sheets

SIMPLIFIED LDPC ENCODING FOR DIGITAL COMMUNICATIONS

CROSS-REFERENCE TO RELATED APPLICATIONS

This application claims priority, under 35 U.S.C. §120, from U.S. patent application Ser. No. 11/201,391 filed Aug. 10, 2005, which claims priority, under 35 U.S.C. §119(e), of Provisional Application No. 60/601,602, filed Aug. 13, 2004, and of Provisional Application No. 60/703,920, filed Jul. 29, 2005, both of which are incorporated herein by this reference.

STATEMENT REGARDING FEDERALLY SPONSORED RESEARCH OR DEVELOPMENT

Not applicable.

BACKGROUND OF THE INVENTION

This invention is in the field of data communications, and is more specifically directed to redundant coding for error detection and correction in such communications.

High-speed data communications, for example in providing high-speed Internet access, is now a widespread utility for many businesses, schools, and homes. In its current stage of development, this access is provided according to an array of technologies. Data communications are carried out over existing telephone lines, with relatively slow data rates provided by voice band modems (e.g., according to the current v.92 communications standards), and higher data rates provided by Digital Subscriber Line (DSL) technology. Another current technology involves the use of cable modems communicating over coaxial cable, often in combination with cable television services. The Integrated Services Digital Network (ISDN) is a system of digital phone connections over which data is transmitted simultaneously across the world using end-to-end digital connectivity. Localized wireless network connectivity according to the IEEE 802.11 standard has become popular for connecting computer workstations and portable computers to a local area network (LAN), and typically through the LAN to the Internet. Broadband wireless data communication technologies, for example those technologies referred to as "WiMAX" and "WiBro", and those technologies according to the IEEE 802.16d/e standards, are now being developed to provide wireless DSL-like connectivity in the Metro Area Network (MAN) and Wide Area Network (WAN) context.

A problem that is common to all data communications technologies is the corruption of data by noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol as received is in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented by the technique of redundant coding. In general, redundant coding inserts data bits into the transmitted data stream that do not add any additional information, but that indicate, on decoding, whether an error is present in the received data stream. More complex codes provide the ability to deduce the true transmitted data from a received data stream even if errors are present.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modern data correction codes have been developed to more closely approach the theoretical limit. An important class of these conventional codes includes the "turbo" codes, which encode the data stream by applying two convolutional encoders. One of these convolutional encoders encodes the datastream as given, while the other encodes a pseudo-randomly interleaved version of the data stream. The results from the two encoders are interwoven to produce the encoded data stream.

Another class of known redundant codes are the Low Density Parity Check (LDPC) codes. The fundamental paper describing these codes is Gallager, *Low-Density Parity-Check Codes*, (MIT Press, 1963), monograph available at http://www.inference.phy.cam.ac.uk/mackay/gallager/papers/. In these codes, a sparse matrix H defines the code, with the encodings c of the payload data satisfying:

$$Hc=0 \qquad (1)$$

over Galois field GF(2). Each encoding c consists of the source message $c_i$ combined with the corresponding parity check bits $c_p$ for that source message $c_i$. The encodings c are transmitted, with the receiving network element receiving a signal vector r=c+n, n being the noise added by the channel. Because the decoder at the receiver also knows matrix H, it can compute a vector z=Hr. However, because r=c+n, and because Hc=0:

$$z=Hr=Hc+Hn=Hn \qquad (2)$$

The decoding process thus involves finding the most sparse vector x that satisfies:

$$Hx=z \qquad (3)$$

over GF(2). This vector x becomes the best guess for noise vector n, which can be subtracted from the received signal vector r to recover encodings c, from which the original source message $c_i$ is recoverable.

There are many known implementations of LDPC codes. Some of these LDPC codes have been described as providing code performance that approaches the Shannon limit, as described in MacKay et al., "Comparison of Constructions of Irregular Gallager Codes", *Trans. Comm.*, Vol. 47, No. 10 (IEEE, October 1999), pp. 1449-54, and in Tanner et al., "A Class of Group-Structured LDPC Codes", *ISTCA*-2001 *Proc.* (Ambleside, England, 2001).

In theory, the encoding of data words according to an LDPC code is straightforward. Given enough memory or small enough data words, one can store all possible code words in a lookup table, and look up the code word in the table according to the data word to be transmitted. But modern data words to be encoded are on the order of 1 kbits and larger, rendering lookup tables prohibitively large and cumbersome. Accordingly, algorithms have been developed that derive codewords, in real time, from the data words to be transmitted. A straightforward approach for generating a codeword is to consider the n-bit codeword vector c in its systematic form, having a data or information portion $c_i$ and an m-bit parity portion $c_p$ such that $c=(c_i|c_p)$. Similarly, parity matrix H is placed into a systematic form $H_{sys}$, preferably in a lower triangular form for the m parity bits. In this conventional encoder, the information portion $c_i$ is filled with n-m information bits, and the m parity bits are derived by back-substitution with the systematic parity matrix $H_{sys}$. This approach is described in Richardson and Urbanke, "Efficient Encoding of Low-Density Parity-Check Codes", *IEEE Trans. on Information Theory*, Vol. 47, No. 2 (February 2001), pp. 638-656. This article indicates that, through matrix manipulation, the encoding of LDPC codewords can be accomplished in a number of operations that approaches a linear relationship with the size n of the codewords. However, the computational efficiency in this and other conventional LDPC encoding techniques does not necessarily translate into an efficient encoder hardware architecture. Specifically, these and other conventional encoder architectures are inefficient because the typically involve the storing of inverse matrices, by way of which the parity check of equation (1), or a corollary, is solved in the encoding operation.

By way of further background, my copending patent application Ser. No. 10/329,597, filed Dec. 26, 2002, now published as U.S. Patent Publication No. 2004/0034828, and my copending patent application Ser. No. 10/806,879, filed Mar. 23, 2004, and now published as U.S. Patent Publication No. 2004/0194007 A1, both commonly assigned herewith and incorporated herein by this reference, describe a family of structured irregular LDPC codes, and decoding architectures for those codes. The quasi-cyclic structure of this family of LDPC codes can also provide efficiencies in the hardware implementation of the encoder, as described in my copending patent application Ser. No. 10/724,280, filed Nov. 28, 2003, now published as U.S. Patent Publication No. 2004/0148560 A1, commonly assigned herewith and incorporated herein by this reference. The encoder and encoding method that are described in U.S. Patent Publication No. 2004/0148560 A1 follow a generalized approach, and are capable of handling such complications as row rank deficiency.

BRIEF SUMMARY OF THE INVENTION

It is an object of this invention to provide a simplified approach to the encoding of information words using structured Low Density Parity Check (LDPC) codes.

It is a further object of this invention to provide efficient encoder circuitry for following this simplified encoding approach.

It is a further object of this invention to provide such encoder circuitry that may be in the form of a programmed microprocessor or digital signal processor.

It is a further object of this invention to provide such an encoding approach that is well-suited for high data rate applications such as wireless broadband communication.

Other objects and advantages of this invention will be apparent to those of ordinary skill in the art having reference to the following specification together with its drawings.

The present invention may be implemented into circuitry for applying LDPC encoding to data words for transmission over a communications facility. The encoder includes a memory for storing the parity portion of the parity check matrix defined by the LDPC code. A factored portion of the parity check matrix is derived, and stored, for the information portion of the parity check matrix and a single block column of the parity portion. The LDPC code is constrained so that a recursion path exists through the parity portion of the parity check matrix. A lower block in the single block column is in the form of a cyclic matrix, the inverse of which is a cyclic matrix. This inverse block, or submatrix, permits solution of the party bits for the single block column, and these parity bits are applied, by way of the recursion path, to the non-factored parity check matrix to derive the remaining parity bits for the associated information word.

DETAILED DESCRIPTION OF THE INVENTION

The present invention will be described in connection with an example of its implementation in an exemplary transceiver, for example a wireless broadband network adapter such as according to the IEEE 802.16 wireless broadband standards. It will be apparent to those skilled in the art having reference to this specification that this invention is particularly well-suited for use in such an application. However, it is also contemplated that this invention will be of similar benefit in many other applications that involve error correction coding, including other types of communications and different media, including other wireless communications such as wireless telephony, and wireless Local Area Network (LAN) communications, such as contemplated according to the IEEE 802.11a/b/g standards; this invention is also contemplated to be beneficial for error correction coding in wired data communications such as involved in conventional Digital Subscriber Line (DSL) broadband communications, cable modem broadband access, wired LAN communications, and even data communications within a single computer system (e.g., error correction as applied to disk drive access). In the communications context, this invention can be used in communications carried out using a wide range of modulation techniques, including single-carrier modulation, and multi-carrier modulation approaches such as orthogonal frequency division multiplexing (OFDM) and discrete multitone modulation (DMT). It is therefore to be understood that these and other alternatives to and variations on the embodiment described below are contemplated to be within the scope of this invention as claimed.

Figure 1:
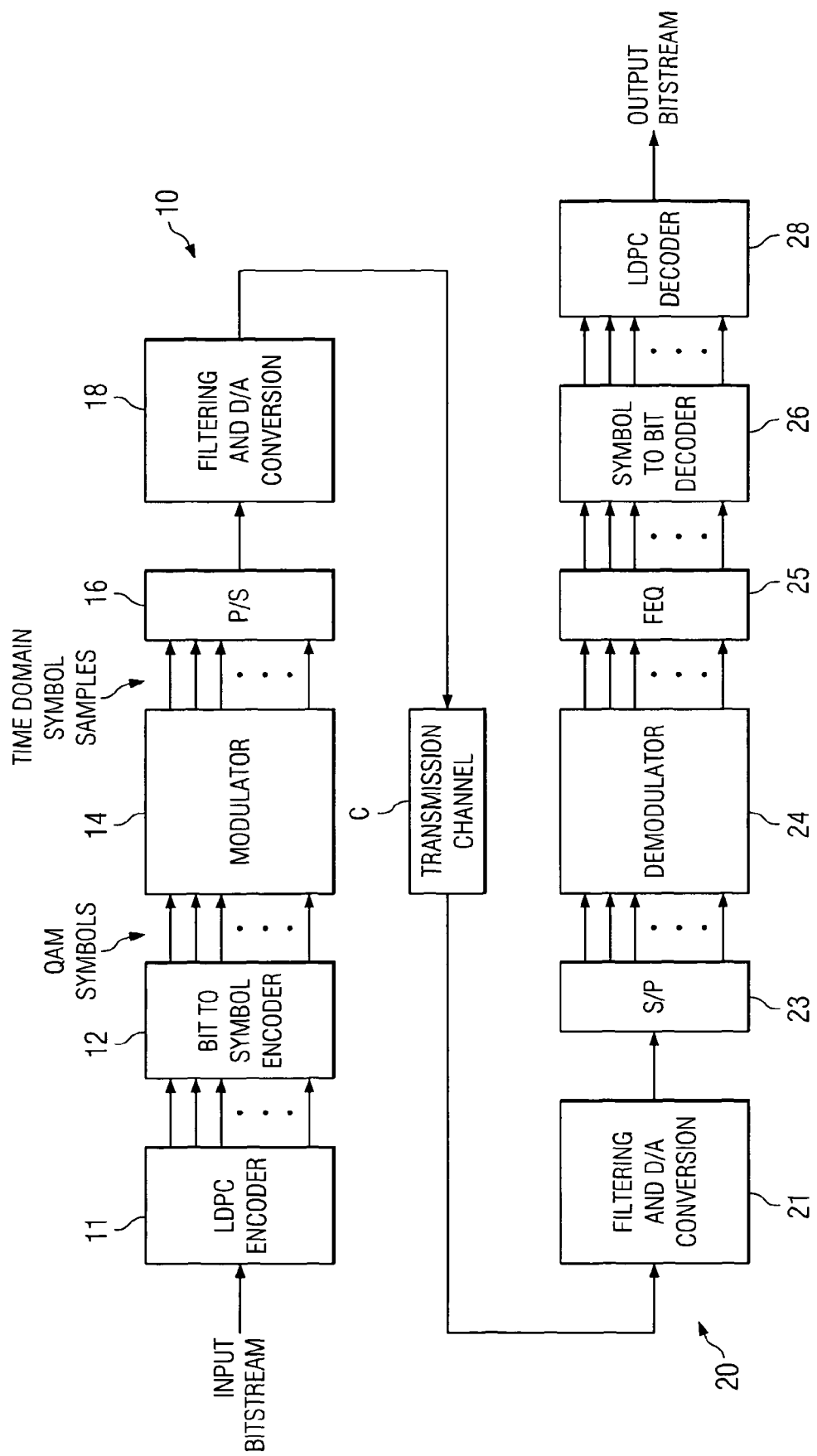
FIG. 1 is a functional block diagram of communications between two OFDM transceivers, where at least the transmitting transceiver is constructed according to a first preferred embodiment of the invention.

FIG. 1 functionally illustrates an example of a somewhat generalized communication system into which the preferred embodiment of the invention is implemented in connection with a wireless broadband communications environment, such as contemplated by the IEEE 802.16 wireless broadband standard. As mentioned above, it is of course contemplated that this generalized arrangement is provided by way of context only. In the system of FIG. 1, only one direction of transmission (from transmitting transceiver 10 over transmission channel C to receiving transceiver 20) is illustrated. It will of course be understood by those skilled in the art that data will also be communicated in the opposite direction, with transceiver 20 as the transmitting transceiver and transceiver 10 as the receiving transceiver. Typically, this reverse communication will be carried out in a similar manner as the "forward" direction communication, but multiplexed in either frequency or time to avoid interference.

As shown in FIG. 1, transmitting transceiver 10 receives an input bitstream that is to be transmitted to receiving transceiver 20. The input bitstream may be generated by a computer at the same location (e.g., the central office) as transmitting transceiver 10, or alternatively and more likely is generated by a computer network, in the Internet sense, that is coupled to transmitting transceiver 10. Typically, this input bitstream is a serial stream of binary digits, in the appropriate format as produced by the data source.

According to this embodiment of the invention, LDPC encoder function 11 digitally encodes the input bitstream for error detection and correction purposes. According to this embodiment of the invention, a redundant LDPC code is applied by encoder function 11, with the particular code selected to facilitate implementation and performance of LDPC encoder function 11, as will be apparent from the following description. The specifics of the code will become apparent from the description of this encoder function, presented below relative to the description of the construction and operation of transmitting transceiver 10 according to the preferred embodiment of the invention. In general, the coded bits include both the payload data bits and also code bits that are selected, based on the payload bits, so that the application of the codeword (payload plus code bits) to the sparse LDPC parity check matrix equals zero for each parity check row. After application of the LDPC code, bit to symbol encoder function 12 groups the incoming bits into symbols that modulate one or more carrier frequencies in the eventual broadband transmission.

Figures 2, 3:
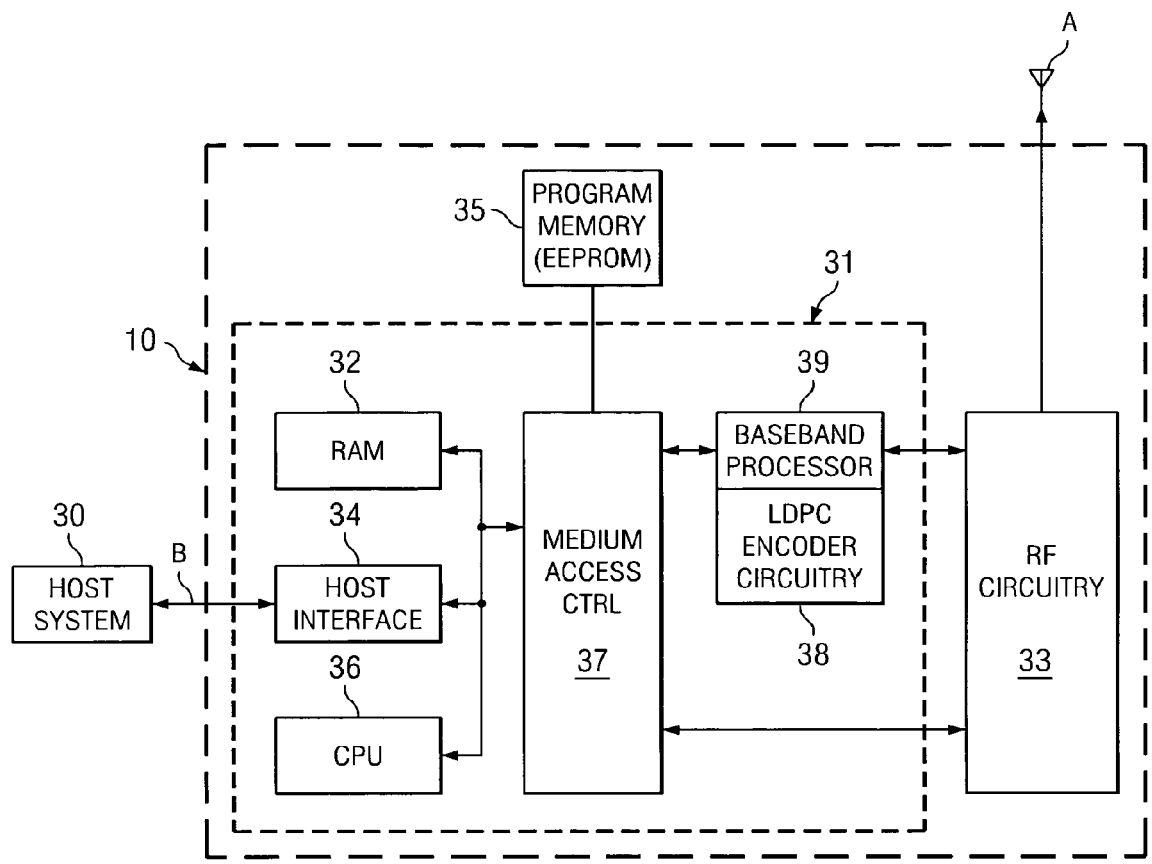
FIG. 2 is an electrical diagram, in block form, of a transceiver constructed according to the preferred embodiments of the invention.
FIG. 3 is an illustration of an example of a macro parity check matrix representation of an LDPC code suitable for use in connection with the preferred embodiment of the invention.

FIG. 2 illustrates an exemplary construction of transmitting transceiver 10, in the form of a wireless broadband network adapter. Transceiver 10 is coupled to host system 30 by way of a corresponding bus B. Host system 30 corresponds to a personal computer, a laptop computer, or any sort of computing device capable of wireless broadband communications, in the context of a wireless wide area network (WAN) or "metro" area network ("MAN"); of course, the particulars of host system 30 will vary with the particular application. In the example of FIG. 2, transceiver 10 may correspond to a built-in broadband wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 20. Examples of suitable buses for bus B include PCI, MiniPCI, USB, CardBus, and the like.

Transceiver 10 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 10 over the wireless channel, both via antenna A. The architecture of spread spectrum processor 31 into which this embodiment of the invention can be implemented follows that of the TNETW1130 single-chip media access controller (MAC) and baseband processor available from Texas Instruments Incorporated, by way of example, and that corresponds to a wireless LAN realization at customer premises equipment. It is contemplated that the architecture of other transceiver installations, including for wireless broadband communications, whether on the network or client side, can follow a similar generic approach, as modified for the particular application location, as known in the art. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 10, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within transceiver 10, in the form of a wireless adapter, are other typical support circuitry and functions that are not shown, but that are useful in connection with the particular operation of transceiver 20.

According to the preferred embodiments of the invention, LDPC encoding is embodied in specific custom architecture hardware associated with baseband processor 39, and shown as LDPC encoder circuitry 38 in FIG. 2. LDPC encoding circuitry 38 is custom circuitry for performing the coding of transmitted and data packets according to the preferred embodiments of the invention. A preferred embodiment of the particular construction of LDPC encoder circuitry 38 according to the preferred embodiment of this invention will be described in further detail below.

Alternatively, it is contemplated that baseband processor 39 itself, or other computational devices within transceiver 20, may have sufficient computational capacity and performance to implement the encoding functions described below in software, specifically by executing a sequence of program instructions. It is contemplated that those skilled in the art having reference to this specification will be readily able to construct such a software approach, for those implementations in which the processing resources are capable of timely performing such encoding.

In either case, referring back to FIG. 1, the encoded symbols are then applied to modulator 14, which generates a datastream according to the particular modulation technique for the communications protocol. The particular modulation applied by modulator 14 may be a single carrier modulation, as used according to some of the options under the IEEE 802.16 wireless broadband standards. Alternatively, modulator 14 may be a multiple-carrier modulator, as used in OFDM modulation contemplated for certain IEEE 802.16 wireless broadband modes, or as used in Discrete Multitone modulation (DMT) for conventional DSL communications. In the case of multiple-carrier modulation, modulator 14 will apply an inverse Discrete Fourier Transform (IDFT) function to the output of encoder 12, to associate each input symbol with one subchannel in the transmission frequency band, and to generate a corresponding number of time domain symbol samples according to the Fourier transform. In any case, to the extent that modulator 14 generates multiple time domain symbol samples, this datastream is converted into a serial stream of samples by parallel-to-serial converter 16. In the single carrier example, functions 11 through 16 convert the input bitstream into a sequence of complex amplitudes (e.g., according to a QAM constellation) corresponding to the symbol values. In the multiple carrier implementation, functions 11 through 16 will convert the input bitstream into a serial sequence of symbol values representative of the sum of a number of modulated subchannel carrier frequencies, the modulation indicative of the various data values, and including the appropriate redundant code bits for error correction. Those skilled in the art having reference to this specification will readily recognize that each of functions 11 through 16 may be carried out, and preferably actually are carried out, as digital operations executed by a digital signal processor (DSP).

Filtering and conversion function 18 then processes the datastream for transmission. Function 18 applies the appropriate digital filtering operations, such as interpolation to increase sample rate and digital low pass filter for removing image components, for the transmission. The digitally-filtered datastream signal is then converted into the analog domain and the appropriate analog filtering is then applied to the output analog signal, prior to its transmission.

The output of filter and conversion function 18 is then applied to transmission channel C, for forwarding to receiving transceiver 20. The transmission channel C will of course depend upon the type of communications being carried out. In the wireless communications context, the channel will be the particular environment through which the wireless broadband or LAN transmission takes place. Alternatively, in the DSL context, the transmission channel is physically realized by conventional twisted-pair wire. In any case, transmission channel C adds significant distortion and noise to the transmitted analog signal, which can be characterized in the form of a channel impulse response.

This transmitted signal is received by receiving transceiver 20, which, in general, reverses the processes of transmitting transceiver 10 to recover the information of the input bitstream. Filtering and conversion function 21 in receiving transceiver 20 processes the signal that is received over transmission channel C. Function 21 applies the appropriate analog filtering, analog-to-digital conversion, and digital filtering to the received signals, again depending upon the technology of the communications. In the DSL context, this filtering can also include the application of a time domain equalizer (TEQ) to effectively shorten the length of the impulse response of the transmission channel C. Serial-to-parallel converter 23 converts the filtered datastream into a number of samples that are applied to demodulator function 24. In the single channel example, demodulator function 24 will convert the received amplitude (typically complex) into a digital symbol value, while in the multiple channel example, demodulator function 24 applies a Discrete Fourier Transform (DFT) to recover the modulating symbols at each of the subchannel frequencies, reversing the IDFT performed by modulator 14 in transmitting transceiver 10. In either case, demodulator 24 outputs a frequency domain representation of a block of transmitted symbols, multiplied by the frequency-domain response of the effective transmission channel. Recovery function 25 then effectively divides out the frequency-domain response of the effective channel, for example by the application of a frequency domain equalizer (FEQ), to recover an estimate of the modulating symbols. Symbol-to-bit decoder function 26 then demaps the recovered symbols, and applies the resulting bits to LDPC decoder function 28.

LDPC decoder function 28 reverses the encoding that was applied in the transmission of the signal, to recover an output bitstream that corresponds to the input bitstream upon which the transmission was based. This output bitstream is then forwarded to the host workstation or other recipient. According to this preferred embodiment of the invention, a preferred architecture for LDPC decoder function 28 is described in the above-incorporated copending patent application Ser. No. 10/329,597, filed Dec. 26, 2002, now published as U.S. Patent Publication No. 2004/0034828, and my copending patent application Ser. No. 10/806,879, filed Mar. 23, 2004, and now published as U.S. Patent Publication No. 2004/0194007 A1, both commonly assigned herewith and incorporated herein by this reference.

LDPC Encoding

The theory of operation of the preferred embodiment of the invention will now be described, following which its implementation into LDPC encoding function 11 in transceiver 10, in the form of LDPC encoder circuitry 38 operating in cooperation with baseband processor 39, will then be described.

By way of nomenclature, the LDPC code is fundamentally contained within an mxj parity check matrix H that satisfies the following equation, when multiplied by the true transmitted code word vector c:

$$H \cdot c = 0 \tag{4}$$

over Galois Field (2). For a single one of the m rows in parity check matrix H, this parity check amounts to:

$$H_1 c_1 + H_2 c_2 + \ldots + H_j c_j = 0 \tag{5a}$$

over GF(2). The example of the parity-check equation (5a) thus logically becomes, for an exemplary row of parity check matrix H having a "1" in its columns 1, 3, 4, and 7:

$$c_1 \oplus c_3 \oplus c_4 \oplus c_7 = 0 \tag{5b}$$

For systematic codes, such as the LDPC codes applied by LDPC encoder circuitry 38 according to this invention, code word vector c expressly contains an information portion $c_i$, which presents the information bits or payload of the code word, and parity portion $c_p$, which presents the parity check bits. For the example of an LDPC code of code rate 1:2, information portion $c_i$ and parity portion $c_p$ each constitute one-half of code word vector c.

Therefore, once the parity check matrix H is defined, and because the information bits $c_i$ of code word vector c are known, the process of encoding amounts to solving the parity check equation:

$$[H_p \mid H_i]\begin{bmatrix} c_p \\ c_i \end{bmatrix} = 0 \quad (6a)$$

for the parity bits $c_p$, where the matrices $H_p$ and $H_i$ correspond to the portions of parity check matrix H that are applied to the parity and information bits of code word vector c, respectively. Rewriting equation (6a), the encoding problem can be expressed as:

$$H_p c_p = H_i c_i \quad (6b)$$

and solving for parity bits $c_p$. In the general case, this solution requires the generation of an inverse matrix, namely the inverse of the parity matrix portion $H_p$. As known in the art, the calculations and memory requirements for such an operation, particularly for relatively large codewords as contemplated in modern communications, requires sufficient resources that this brute force approach to solving for parity portion $c_p$ for a given information portion $c_i$ is not efficient, especially in the hardware sense.

This encoding of a message frame can be executed in a straightforward if not brute force manner, using conventional programmable integrated circuits such as digital signal processors and the like. Examples of recent encoding techniques are described in Richardson and Urbanke, "Efficient Encoding of Low-Density Parity-Check Codes", *IEEE Trans. on Information Theory*, Vol. 47, No. 2 (February 2001), pp. 638-656. However, as mentioned above, these conventional techniques do not lend themselves to efficient hardware realization. The encoders described in my copending patent application Ser. No. 10/724,280, filed Nov. 28, 2003, now published as U.S. Patent Publication No. 2004/0148560 A1, commonly assigned herewith and incorporated herein by this reference, take advantage of the quasi-cyclic structure of the family of LDPC codes described in U.S. Patent Publication No. 2004/0034828 and No. 2004/0194007 A1 to arrive at substantial efficiencies in the encoding process and hardware.

FIG. 3 illustrates an example of a macro parity check matrix $H_M$, which represents an LDPC parity check matrix H. Macro parity check matrix $H_M$ illustrates that parity check matrix H has a column and row block structure in which each matrix entry represents a submatrix block that, according to this invention, is a pxp submatrix. In this example, therefore, because macro parity check matrix $H_M$ has twenty-four block columns and twelve block rows, the full parity check matrix H has 24p columns and 12p rows. In this representation of FIG. 3, each "1" entry in macro parity check matrix $H_M$ indicates that the corresponding pxp submatrix, or block, is a cyclically shifted identity matrix. Those entries of macro parity check matrix $H_M$ that are zero-valued (shown blank in FIG. 3, for clarity), correspond to a zero-valued block at that location. As evident from the representation of macro parity check matrix $H_M$ of FIG. 3, parity check matrix H is indeed a low density, or sparse, matrix. And in this example, the first twelve block columns (1 through 12) of macro parity check matrix $H_M$ correspond to parity matrix portion $H_p$ of equations 6a and 6b, while the last twelve block columns (13 through 24) of macro parity check matrix $H_M$ correspond to the information matrix portion $H_i$ of equations 6a and 6b. As such, the code represented by macro parity check matrix $H_M$, in this example, has a code rate of 1:2.

In a general sense, encoding according to the preferred embodiment of the invention is based on the initial factoring of macro parity check matrix $H_M$ into a form, similar to that of FIG. 3, in which one block section of parity matrix portion $H_p$ can be resolved from the product of information matrix portion $H_i$ with the known information portion $c_i$. Once this block section is solved, and its corresponding parity bits known, the encoding approach according to the preferred embodiment of the invention reverts to the original macro parity check matrix $H_M$ to recursively solve for the other parity bits.

In the example of FIG. 3, the solvable block portion of macro parity check matrix $H_M$ is (or is arranged to be, by rearrangement of the columns) the twelfth block column. The first eleven block columns of macro parity check matrix $H_M$ each have a column weight of two and, over those first eleven block columns, each of the block rows have a row weight of two or less. The twelfth block column (i.e., the solvable block portion) need not fit these constraints, and in this example does not so fit (e.g., because it has a block column weight of three). It has been observed, according to this invention, that this structure of a macro parity check matrix $H_M$ is relatively common within the family of LDPC codes described in U.S. Patent Publication No. 2004/0148560 A1, especially considering that the columns within the parity check matrix H can be freely rearranged, as known in the art. As will be evident from the following description, the positions and numbers of non-zero entries provide a recursion path by way of which the parity bits $c_p$ can be solved once the solvable block portion (e.g., the twelfth block column in FIG. 3) is solved, according to the preferred embodiment of the invention. It is contemplated that other arrangements of the non-zero entries and other matrix structures may also provide such a recursion path, permitting solution of the parity bits $c_p$ according to this invention.

Figure 4:
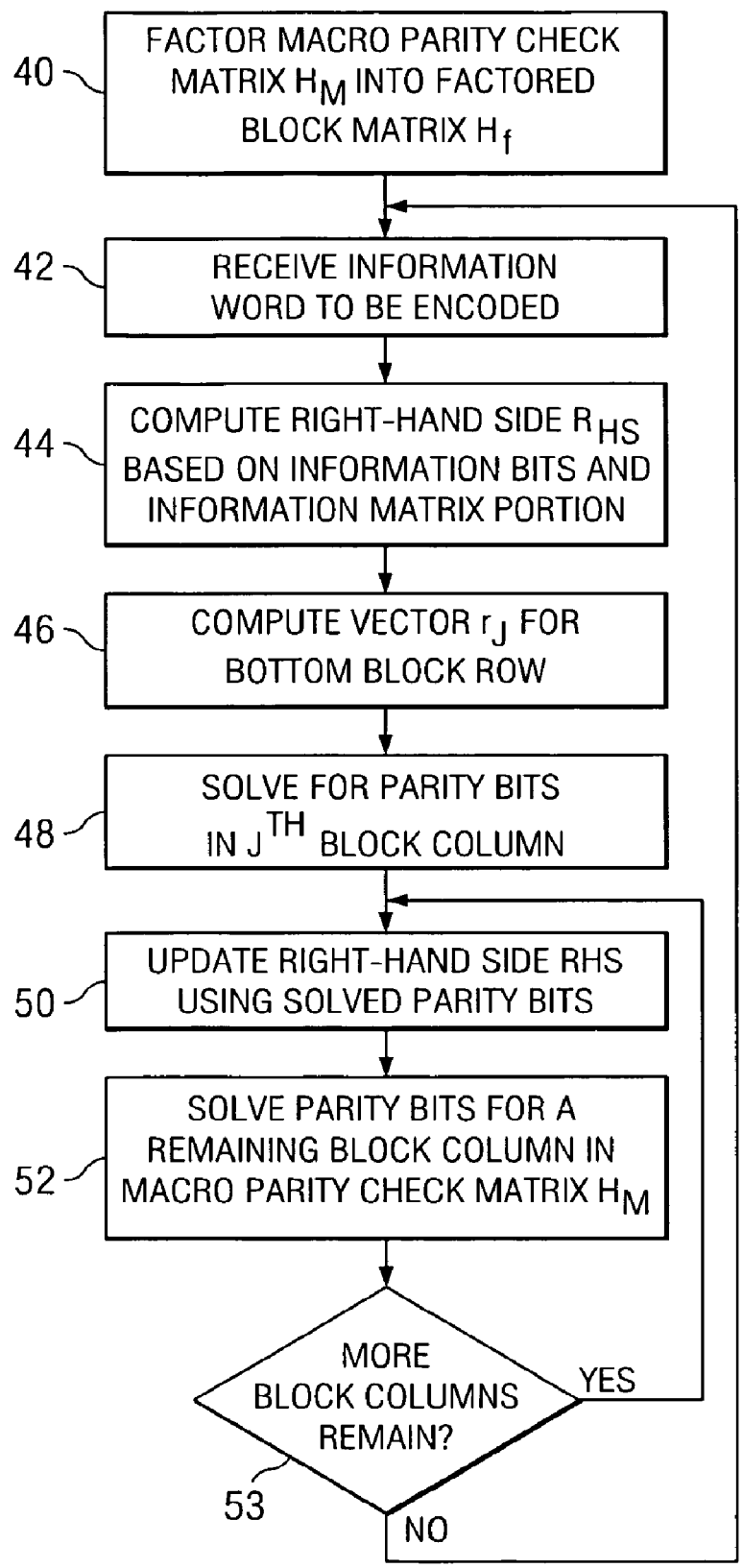
FIG. 4 is a flow diagram illustrating the operation of the encoding method according to the preferred embodiment of the invention.

Encoding of data in this manner, and according to the preferred embodiment of this invention, will now be described with reference to the generalized flow chart of FIG. 4.

According to the preferred embodiment of this invention, preparation for encoding (i.e., processing that is performed before receiving information bits $c_i$ that are to be encoded) includes cyclic factorization of parity check matrix H into a factored form $H_f$:

$$H_f = \left[ \begin{array}{c|c|c} H_{fp} & \alpha & H_{fi}^U \\ \hline 0 & B & H_{fi}^L \end{array} \right] \quad (7)$$

where submatrix B is a pxp submatrix (i.e., one column block by one row block), occupying the $J^{th}$ block row and $J^{th}$ block column position of factored parity check matrix $H_f$, J being the position of one of the block columns within parity matrix portion $H_p$ and establishing the solvable column block portion described above. In this example, equation (7) illustrates that the block row containing submatrix B is the bottom block row, but of course it will be understood that this block row, containing submatrix B and zero-valued entries for the remainder of the parity portion, can be at any selected block row position; the bottom block row position, of this example, tends to facilitate visualization of the solution process. This factoring corresponds to process 40 of FIG. 4. A description of the method of factoring a parity check matrix into a form such as that of equation (7) is provided in U.S. Patent Publication No. 2004/0148560 A1, incorporated herein by reference. In this factored form, submatrix α is a submatrix of p columns (one column block) by (n−1)p rows (n being the number of row blocks in the corresponding macro parity check matrix $H_M$). Submatrices $H_{fi}^U$ and $H_{fi}^L$ correspond to factored upper and lower portions of information portion matrix $H_i$. Submatrix $H_{fp}$ is the remaining factored portion of parity matrix portion $H_p$. All of the submatrices in factored parity check matrix $H_f$ are block matrices, within which each entry (block) is a pxp cyclic matrix, with a weight that is not constrained to one as a result of the factoring operation. According to the preferred embodiment of this invention, submatrix B is an invertible cyclic matrix, and submatrix $H_{fp}$ has a block upper triangular structure. These properties of factored parity check matrix $H_f$ and its submatrices are attained by conventional row and column reordering, row factorization, and other operations as described in U.S. Patent Publication No. 2004/0148560 A1, in combination with selection of the LDPC code from the family of codes that is also described in U.S. Patent Publication No. 2004/0148560 A1. It is contemplated that those skilled in the art, having reference to this specification, will be readily able to select such a code, and apply the appropriate reordering and factoring, to derive such a factored parity check matrix $H_f$. The factoring of parity check matrix H in process 40 is, in practice, preferably accomplished prior to encoding (and, indeed, may be hardwired or pre-stored into the encoding hardware or software of the encoding transceiver), as these calculations are not dependent on the data being encoded.

Once factored parity check matrix $H_f$ is established in this manner, encoding of data can commence. In process 42, an information word $c_i$ that is to be encoded is received by the encoder, which, in combination with the parity check matrix H (as factored in process 40) leaves only the parity bits $c_p$ as unknown. As discussed above, the encoding operation amounts to solving equation 6b:

$$H_p c_p = H_i c_i \quad (6b)$$

or, using the conventional matrix mathematics nomenclature of a "right-hand side" $R_{HS}$:

$$H_i c_i \equiv R_{HS} \quad (8)$$

In a recursive solution approach, as used according to this embodiment of the invention, the right-hand side $R_{HS}$ will be updated as each parity section is solved, permitting solution for a next parity section from the "left-hand side". In process 44 of FIG. 4, the right-hand side $R_{HS}$ is computed, according to the preferred embodiment of the invention, preferably by a summation of a series of vector products, each product involving summed cyclic shifts, as described in U.S. Patent Publication No. 2004/0148560 A1, incorporated herein by reference. In this calculation of the right-hand side values $R_{HS}$ based on the information bits $c_i$ only, it is the original (non-factored) parity check matrix $H_i$ that is utilized.

The parity bits $c_p$ associated with the block column containing submatrix B of equation 7 are now solved. In general, this operation involves evaluation of:

$$r_J = H_{fi}^L c_i \quad (8a)$$

to derive the matrix-vector product $r_J$, which is a vector of size p for the $J^{th}$ (bottom) block row of the factored parity matrix $H_f$ which is performed in process 46 in this example For some cases in which the factorization is simple, vector $r_J$ can be computed by applying, to the right-hand side values $R_{HS}$, the same factorization steps as used to produce factored parity check matrix portion $H_{fi}^L$ from original information parity matrix portion $H_i$. This matrix vector product $r_J$ is, of course, the product of submatrix B with the yet-unknown parity bits $c_{p,J}$ for the $J^{th}$ block column. But, as mentioned above, submatrix B is an invertible cyclic matrix, and as such:

$$c_{p,J} = B^{-1} r_J \quad (8b)$$

And because the inverse of a cyclic matrix is itself a cyclic matrix, submatrix $B^{-1}$ is a cyclic matrix. The solution of equation 8b, performed in process 48 in this example, is therefore a simple calculation for digital circuitry. In process 50, these newly-solved parity bits $C_{p,J}$ are used to update the right-hand side values:

$$R_{HS} \Leftarrow H_{p,J} c_{p,J} + R_{HS} \quad (9)$$

by adding, to the previous right-hand side value, the vector product of these newly-solved parity bits $c_{p,J}$ with the corresponding block $J^{th}$ column (considering the non-zero entries in the entire block column, over all rows). Once the parity bits $c_{p,J}$ for the $J^{th}$ block column are solved and the right-hand side values $R_{HS}$ updated, the recursive solution of the remaining parity bits begins, with process 52.

According to the preferred embodiment of this invention, the recursive solution for the remaining parity bits uses the original parity check matrix H rather than the factored parity check matrix $H_f$. The use of the original parity check matrix H takes advantage of the constrained block row and block column weights that establish the recursion path, as will be evident from this description, which will refer to FIG. 3 by way of example. Macro parity check matrix $H_M$ is a useful abstraction of original parity check matrix H, for purposes of this description.

In the first pass of process 52, parity bits $c_{p,J}$ for the $J^{th}$ block are known from process 48. In the example of FIG. 3, parity bits $c_{p,J}$ correspond to the parity bits $c_{p,12}$ because J=12 in that example. Knowledge of parity bits $c_{p,12}$ permits solution of the parity bits for block column 1, because both block column 12 and block column 1 have non-zero entries in block row 1, and because the row weight of block row 1 is one over the remaining eleven block columns in the parity portion $H_p$. Accordingly, this first pass of process 52 solves for parity bits $c_{p,1}$ by solving:

$$c_{p,1} = P_{1,1}^{-1} r_1 \quad (10a)$$

where $r_1$ is the contents, in block row 1, of the updated right-hand side value from process 50, including the results from the solution of parity bits $c_{p,12}$ in process 48, and where $P_{1,1}^{-1}$ is the inverse of the block, or submatrix, represented by row 1 and column 1 of macro parity matrix $H_M$. As described above, the LDPC code is selected, and parity matrix H is arranged, so that each submatrix such as $P_{1,1}$ is a cyclically shifted identity matrix, the inverse of which (i.e., submatrix $P_{1,1}^{-1}$) is also a cyclically shifted identity matrix. The product on the right-hand side of equation 10a is thus a simple circular shift of the vector $r_1$ from the updated right-hand side value. As a result of process 52, additional parity bits, namely parity bits $c_{p,1}$ associated with block column 1 in this example, are determined for the eventual code word c.

Decision 53 determines whether additional block columns remain, in macro parity matrix $H_M$, for which the parity bits $c_p$ are still to be determined. If so (decision 53 is YES), process 50 is repeated to update the right-hand side value $R_{HS}$:

$$R_{HS} \Leftarrow H_{p,1} c_{p,1} + R_{HS} \quad (10b)$$

for this example, in which the most recently solved parity bits were solved for block column 1, and for all non-zero entries in parity matrix block column $H_{p,1}$ (not just submatrix $P_{1,1}$ for block column 1 and block row 1, as used in process 52).

The next instance of process 52 is then executed, for the remaining block column in parity matrix portion $H_p$ having a remaining block row weight of one after removing the previously solved block column to the right-hand side. In the example of FIG. 3, the parity bits $c_{p,1}$ associated with block column 1 are now solved and moved to the right-hand side values, and these values are linked into parity matrix portion $H_p$ via block row 7. This knowledge of parity bits $c_{p,1}$ thus leaves block column 11 as a remaining block column in parity matrix portion $H_p$ with a block row of weight one, and as such, the next pass of process 52 computes:

$$c_{p,11}=P_{7,11}^{-1}r_7 \quad (10c)$$

$r_7$ being the contents, in block row 7, of the updated right-hand side value and $P_{7,11}^{-1}$ being the inverse of the submatrix in block row 7 and column row 11 of macro parity matrix $H_M$. Decision 53 again returns a YES result, and the right-hand side is updated in process 50:

$$R_{HS} \Leftarrow H_{p,11}c_{p,11}+R_{HS} \quad (10d)$$

using the most recently solved parity bits $c_{11}$ for block column 11 and for the non-zero entries in parity matrix block column $H_{p,11}$. The remaining parity bits $c_p$ are solved in a similar manner, following the recursion path through parity matrix portion $H_p$ established by its non-zero entries. For the example of FIG. 3, these subsequent iterations can be expressed by the following equations (each of which combine solution process 52 with the right-hand side update of the subsequent process 50):

$$c_{p,6}=P_{12,6}^{-1}(P_{12,11}c_{p,11}+r_{12}) \quad (10e)$$

where vector $r_{12}$ is the updated right-hand side value, in block row 12, and showing the matrix product of submatrix $P_{12,11}$ with the most recently solved parity bits $c_{11}$ for block column 11. In fact, because the vector r for this block row is used only for this next iteration, the full set of right-hand side values $R_{HS}$ need not be updated. The remaining equations thus follow similarly:

$$c_{p,10}=P_{6,10}^{-1}(P_{6,6}c_{p,6}+r_6) \quad (10f)$$

$$c_{p,5}=P_{11,5}^{-1}(P_{11,10}c_{p,10}+r_{11}) \quad (10g)$$

$$c_{p,9}=P_{5,9}^{-1}(P_{5,5}c_{p,5}+r_5) \quad (10h)$$

$$c_{p,4}=P_{10,4}^{-1}(P_{10,9}c_{p,9}+r_{10}) \quad (10i)$$

$$c_{p,8}=P_{4,8}^{-1}(P_{4,4}c_{p,4}+r_4) \quad (10j)$$

$$c_{p,3}=P_{9,3}^{-1}(P_{9,8}c_{p,8}+r_9) \quad (10k)$$

$$c_{p,7}=P_{3,7}^{-1}(P_{3,3}c_{p,3}+r_3) \quad (10l)$$

$$c_{p,2}=P_{8,2}^{-1}(P_{8,7}c_{p,7}+r_8) \quad (10m)$$

Figure 5:
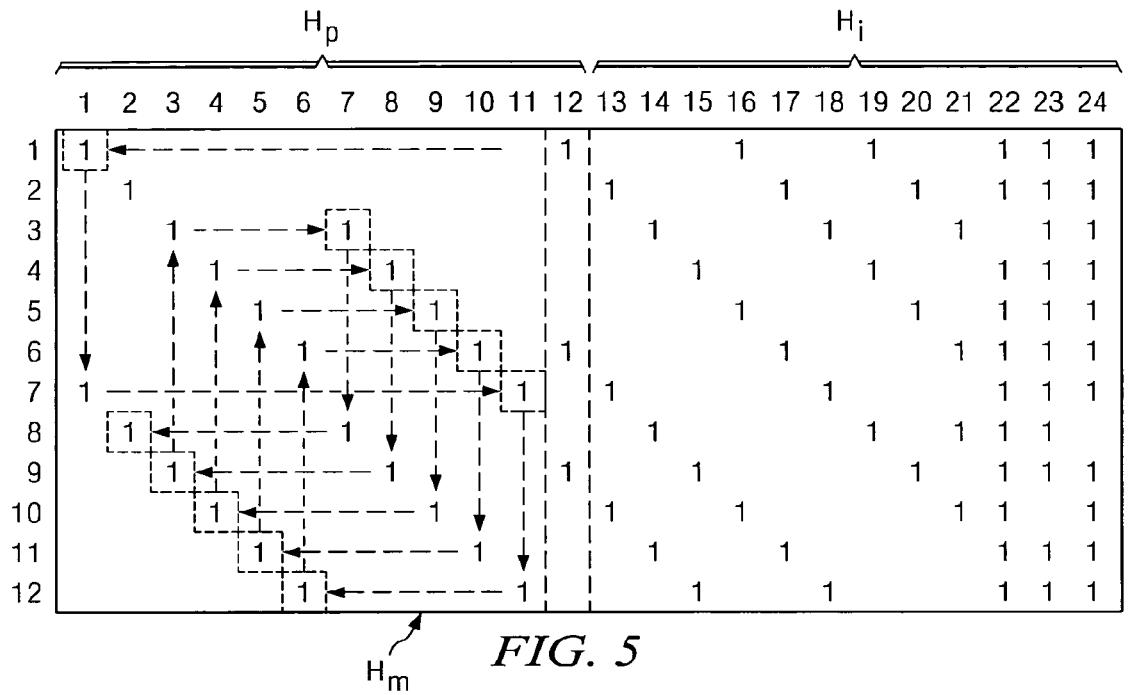
FIG. 5 is an illustration of the solution of the parity portion of a coding, using the code illustrated in FIG. 3 and following a recursion path within the parity portion of the macro parity check matrix.

The recursion path corresponding to these equations, through exemplary macro parity matrix $H_M$ of FIG. 3, is illustrated in FIG. 5. The dashed boxes around particular ones of the entries highlight the inverse submatrix $P_{j,k}^{-1}$ position at which the corresponding parity bits $c_{p,k}$ are solved in process 52.

The example of FIG. 3 also illustrates the existence of an alternative recursion path that may be followed in processes 50, 52 and decision 53 instead of, or in addition to, that shown in FIG. 5. As evident from FIG. 3, block row 2 in parity matrix portion $H_p$ has a block row weight of one. Accordingly, the parity bits $c_{p,2}$ can be solved directly from the right-hand side values (independent of the solving of parity bits $c_{p,12}$ in this example) by:

$$c_{p,2}=P_{2,2}^{-1}r_2 \quad (11)$$

following which a recursion path solving for parity bits $c_{p,2}$, then parity bits $c_{p,7}$, $c_{p,3}$, $c_{p,8}$, $c_{p,4}$, $c_{p,9}$, $c_{p,5}$, $c_{p,10}$, $c_{p,6}$, $c_{p,11}$, and $c_{p,1}$ could be followed. This path is the reverse of the path shown in FIG. 5. If this alternative path is pursued solely, the solution of parity bits $c_{p,J}$ (J=12, in this example) by inversion of submatrix B is still required prior to solution for any block column that has a non-zero entry in the same block row in which block column J also has a non-zero entry (e.g., block column 3 in the example of FIG. 3). Further in the alternative, depending upon the computational capacity and hardware capability for the encoder, both paths may be followed simultaneously and in parallel, reducing the solution time by half.

Referring back to FIG. 4, upon the parity bits $c_{p,j}$ for the last unsolved block column being solved, decision 53 returns a NO result. Control then passes back to process 42, in which the information word to be encoded is received, following which the encoding process repeats from process 44.

Encoding of digital data for communication according to this preferred embodiment provides numerous important advantages, relative to conventional encoding techniques. In addition, by constraining the LDPC codes in the family of codes described in U.S. Patent Publication No. 2004/0148560 A1, as described above in connection with this invention, the storage requirements for the description of the LDPC code can be much reduced (i.e., only the original parity check matrix need be stored for the parity portion, rather than both the original parity check matrix and its factored version), as can the amount of computation involved in the encoding process. Additionally, the encoding hardware or functionality requirements can also be substantially reduced, as will now be described relative to FIG. 6, which illustrates the construction of LDPC encoder circuitry 38 (FIG. 2) according to the preferred embodiment of the invention.

LDPC encoder circuitry 38 includes certain memory resources and computational units, all operating under the control of controller 100. Controller 100 is constructed in the conventional manner, for example as a control state machine, control ROM, or in another known arrangement, to control the operation of the various constituents of LDPC encoder circuitry 38 to effect the operations described herein. Specifically, it is contemplated that controller 100 can control the sequence of operations performed by LDPC encoder circuitry 38, including accessing of the various memory and register resources, and causing the operative logic circuitry to perform its particular functions upon the appropriate operands. It is contemplated that those skilled in the art having reference to this specification will be able to readily realize the construction of controller 100 to perform these functions, using conventional techniques.

On the input side, the memory resources in LDPC encoder circuitry 38 include matrix shift value memory 82, which stores the definition of the various shift values of the original parity check matrix H. As described above, because each non-zero block entry of the parity check matrix portion $H_p$ (other than the $J^{th}$ block column including submatrix B, or more properly its inverse $B^{-1}$, which will typically have a weight greater than one) corresponds to a cyclically shifted identity matrix, each block will have a weight of one, and as such each entry in matrix shift value memory 82 need only store the shift position of the identity diagonal for its corresponding block. Information parity check matrix portion $H_i$ can also be stored in matrix shift value memory 82, in this manner. In general, matrix shift value memory 82 will store both the shift values, and a weight value, associated with inverse submatrix $B^{-1}$ and for the factored information check matrix portion $H_{f,i}^L$. Certain codes may require even less information to be stored, for example if each non-zero submatrix has the same shift value, or if the shift values follow a pattern. In such cases, there may not even be express "storage" of the shift values, but rather the values and patterns may be expressed in controller logic. For the general case, the contents of memory 82 completely specifies parity check matrix H. Another input memory resource in LDPC encoder circuitry 38 is information bit vector memory 84, which receives and stores the information bits $c_i$ to be encoded.

Output and working memory resources in LDPC encoder circuitry 38 include right-hand side value memory 89, which stores the results of matrix multiplications between the information bit vector stored in memory 84 and the entries in parity check matrix H (generated in processes 44, 46 and updated in each iteration of process 50), and as will be described below. Parity bit memory 90 stores the resulting parity portion $c_p$ from the encoding process carried out by LDPC encoder circuitry 38.

The computational resources in LDPC encoder circuitry 38 include cyclic multiply unit 88, which effects many of the calculations involved in the encoding process, as will be described below.

Figure 6:
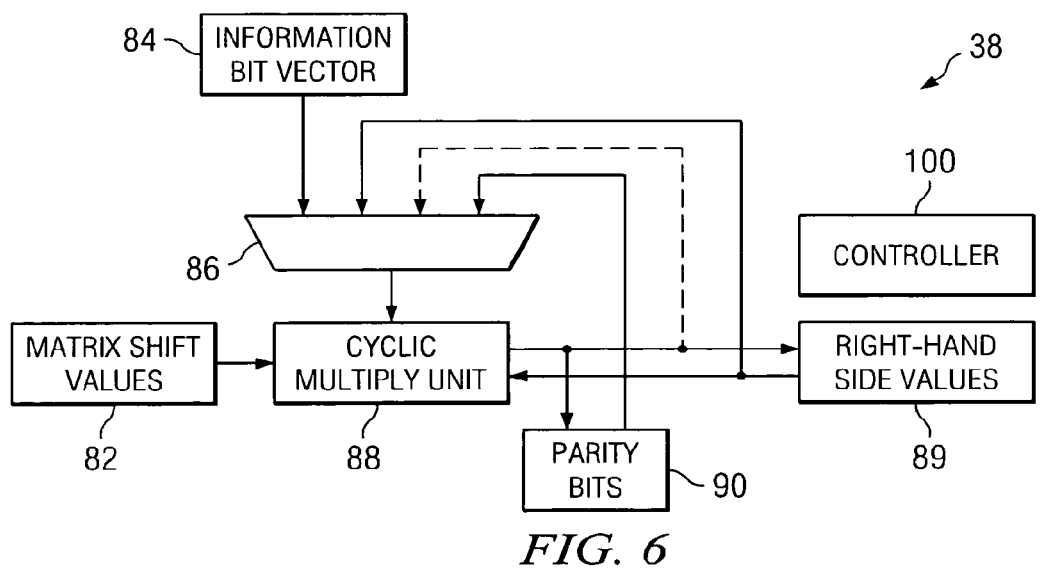
FIG. 6 is an electrical diagram, in block form, of encoder circuitry in the transceiver of FIG. 2, constructed according to the preferred embodiment of the invention.

The interconnection of these memory and computational resources within LDPC encoder circuitry 38 is illustrated in FIG. 6. As shown, matrix shift value memory 82 is connected to cyclic multiply unit 88. Cyclic multiply unit 88 also receives operands from information bit vector memory 84, right-hand side value memory 89, and parity bit memory 90, via multiplexer 86, which is controlled by controller 100 according to the operations being performed. Optionally, a direct connection from the output of cyclic multiply unit 88 may also be applied to another input of multiplexer 86 to directly feed subsequent calculations, as will be described below. The output of cyclic memory unit is coupled to right-hand side value memory 89, and also to parity bit memory 90. Of course, two or more memories 82, 84, 89, 90 may be combined with one another into a combined physical memory, or indeed all such memory resources may be realized within in a single physical memory. It is contemplated that the specific memory architecture may be selected according to the particular application of encoder 38, by the skilled artisan having reference to this specification.

Figure 7:
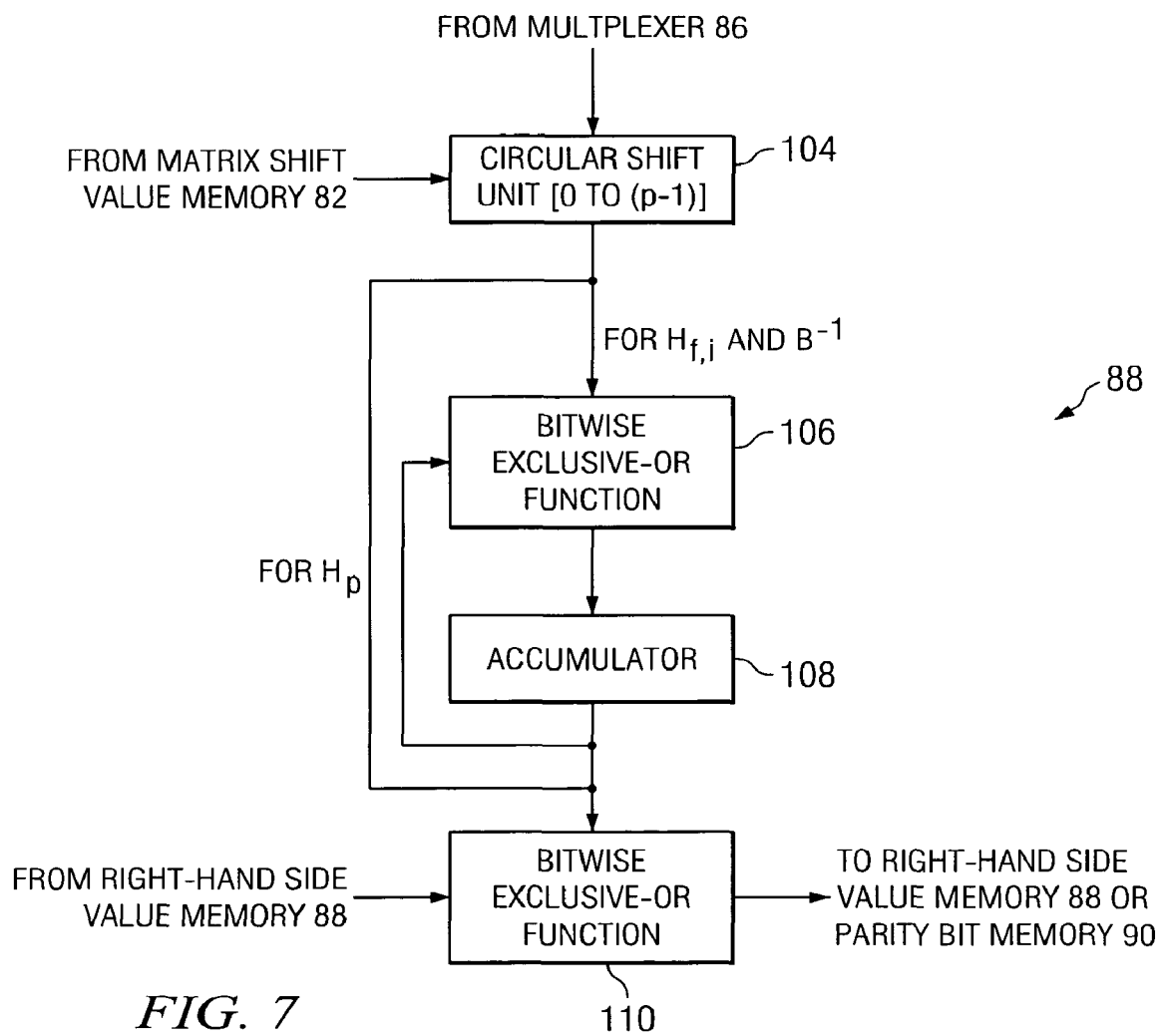
FIG. 7 is an electrical diagram, in block form, of a cyclic multiply unit in the encoder of FIG. 6, constructed according to the preferred embodiment of the invention.

Referring now to FIG. 7, the construction of cyclic multiply unit 88 will now be described in detail. This construction will also illustrate the operation of cyclic multiply unit 88 in the encoding process of FIG. 4 described above, and will illustrate the efficiency with which the encoding of LDPC codes is attained according to this preferred embodiment of the invention.

Cyclic multiply unit 88 includes circular shift unit 104, which is a circular shifter, or barrel shifter, that can receive p bits of a selected segment of information portion $c_i$ from information bit vector memory 84, or of a segment of information from another input source via multiplexer 86. The particular segment received by circular shift unit 104 is selected under the control of controller 100, and constitutes that portion to be operated upon by cyclic multiply unit 88, depending on the operation. Circular shift unit 104 can shift these received bits by a number of bit places from 0 to p−1 responsive to a shift value received from matrix shift value memory 82.

For purposes of evaluating matrix operations involving a cyclic submatrix having a weight greater than one (e.g., inverse submatrix $B^{-1}$ as used in process 48, and the information portion of factored parity check matrix $H_f$ as applied in process 46), the output of circular unit 104 is applied to one input of bitwise exclusive-OR function 106; the output of bitwise exclusive-OR function 106 is applied to the input of accumulator 108, and the output of accumulator 108 is applied as a second input to bitwise exclusive-OR function 106. Bitwise exclusive-OR function 106 is combinational logic for performing an exclusive-OR logic operation, bit-by-bit, on the data words received at its inputs. The output of accumulator 108 is applied to bitwise exclusive-OR function 110, which receives another input from right-hand side value memory 89, and presents its output as the output of cyclic multiply unit 88 to right-hand side value memory 89, or to parity bit memory 90. Bitwise exclusive-OR function 110 thus serves as a modulo-2 accumulator, in which the output of accumulator 108 are subtracted (which, in modulo-2 arithmetic, is effectively an accumulation) from a current right-hand side value from memory 89.

For purposes of evaluating matrix operations involving a cyclic submatrix having a weight of one, the output of circular shift unit 104 is directly applied to bitwise exclusive-OR function 110, as the multiple exclusive-OR and accumulation operations are unnecessary. This "direct" connection may, of course, be effected simply by way of bitwise-exclusive-OR function 106 combining a zero value with the output of circular shift unit 104, for a single pass through functions 106, 108. It is also contemplated that, by further constraining the LDPC code so that submatrix B is necessarily a weight one cyclic matrix (i.e., a cyclically shifted identity matrix), while of course maintaining the other constraints regarding the recursion path in parity check matrix $H_M$, exclusive-OR function 106 and accumulator 108 can be eliminated from cyclic multiply unit 88. In such a case, parity check matrix $H_M$ may be factored simply by adding all block rows together.

In operation, cyclic multiply unit 88 performs matrix operations useful in the encoding of the LDPC code, according to the processes described above relative to FIGS. 3 through 5. One such operation is performed by cyclic multiply unit 88 performing process 44 to derive the initial right-hand side values $R_{HS}$ according to equation (8), and loading these values into right-hand side value memory 89. These initial right-hand side values are determined using each non-zero block of the information portion of parity check matrix $H_i$, one block at a time. According to the preferred embodiment of the invention, the appropriate segment of information portion $c_i$, is forwarded to circular shift unit 104. Circular shift unit 104 shifts the received segment by a shift value received from matrix shift value memory 82, corresponding to the cyclically shifted diagonal within a current block of information parity check matrix portion $H_i$. The result of this shift is accumulated into right-hand side value memory 89. For these operations, bitwise exclusive-OR function 106 and accumulator 108 are effectively bypassed, with bitwise exclusive-OR function 110 applying previous right-hand side results from memory 88. Alternatively, accumulation of right-hand side results along a block row can be performed by using exclusive-OR function 106 and accumulator 108. This operation continues for all blocks of information parity check matrix portion $H_i$.

Process 46 involves deriving the vector $r_J$ for the bottom block row, as described above relative to equation (8a). This evaluation is carried out beginning with circular shift unit 104 shifting a received segment of information portion $c_i$ by a shift value received from matrix shift value memory 82, for a first one of the cyclically shifted diagonals within a current block of factored parity check matrix $H_{f,i}^L$. The shifted result is stored in accumulator 108. Circular shift unit 104 then shifts the information segment by a next value, if the weight of the block exceeds one, and this shifted segment is exclusive-ORed with the previous contents of accumulator 108 by bitwise exclusive-OR function 106. This process continues, until all diagonals within the current block have been calculated, at which point the contents of accumulator 108 are accumulated into right-hand side value memory 89 by bitwise exclusive-OR function 110, which receives the existing contents of right-hand side value memory 89 at its second input. This operation continues for all blocks of the information portion $H_{f,i}^L$ of factored parity check matrix $H_f$, which is, of course, restricted to the bottom block row.

In process 48, cyclic multiply unit 88 is then operated to solve for the parity values associated with the $J^{th}$ block column, using the inverse submatrix $B^{-1}$, and the values for the bottom block row right-hand side vector $r_J$ from process 46, following equation (8b). As mentioned above, in this case, inverse submatrix $B^{-1}$ is itself a cyclic matrix, because submatrix B is a cyclic matrix. Accordingly, matrix shift value memory 82 preferably stores the shift values for inverse submatrix $B^{-1}$. To then solve the parity bits $c_{p,J}$ from equation (8b), cyclic multiply unit 88 loads the bottom block row right-hand side vector $r_J$ from right-hand side value memory 84, via multiplexer 86, into circular shift unit 104. Vector $r_J$ is then shifted by circular shift unit 104, by a first shift value for inverse submatrix $B^{-1}$ received from matrix shift value memory 82, and the shifted result is stored in accumulator 108. For additional diagonals within submatrix B, vector $r_J$ is shifted again by circular shift unit 104, and accumulated with the prior contents of accumulator 108. Upon completion of the block matrix operations for inverse submatrix $B^{-1}$, the result in accumulator 108 is forwarded to parity bit memory 90, as the corresponding parity bits $c_{p,J}$.

Once these parity bits are determined, then cyclic multiply unit 88 executes update process 50, by applying the parity bits $c_{p,J}$ to the other blocks within the $J^{th}$ block column. In this process, multiplexer 86 forwards parity bits $c_{p,J}$ to circular shift unit 104, which shifts these input bits by the matrix shift value from memory 82 for the corresponding blocks in the $J^{th}$ block column, and the result is accumulated with the corresponding block row portion from right-hand side value memory 89, using bitwise exclusive-OR function 110. Upon completion of process 50, the right-hand side value memory 89 is updated so that the $J^{th}$ block column is now part of the "right-hand side", as in equation (9).

Process 52 is then performed to solve for the parity bits in a selected block column in the parity portion of the original, non-factored, parity check matrix H. Controller 100 determines the particular block row and block column that is to be evaluated in this instance, and causes right-hand side value memory 89 to present the appropriate contents $r_k$ for that selected $k^{th}$ block row to multiplexer 86, and causes matrix shift value memory 82 to apply the corresponding shift value for the particular submatrix (inverse submatrix) $P_{k,m}^{-1}$ in the selected $k^{th}$ block row and $m^{th}$ block column to cyclic multiply unit 88. The $k^{th}$ block row and $m^{th}$ block column are selected according to the design of the particular LDPC code and the specific recursion path that is to be followed, which is of course known in advance, thus, for example, following equation (10c). Cyclic multiply unit 88 thus effects process 52 by shifting the received right-hand side contents $r_k$ by the value indicated by the shift value for the inverse matrix $P_{k,m}^{-1}$, by the operation of circular shift unit 104 and exclusive-OR function 110, thus generating the parity bits $c_{p,m}$, which are forwarded to parity bit memory 90. These parity bits $c_{p,m}$ are then forwarded back to cyclic multiply unit 88 for updating of the right-hand side values in process 50 (assuming that additional block columns are to be processed, i.e., assuming that decision 53 is YES). The forwarding of parity bits $c_{p,m}$ may follow the optional path shown in FIG. 6 (which may be realized by parity bit memory 90 having a path or mode by way of which it can immediately forward its input values), or may be accomplished by retrieval of these bits from parity bit memory 90 after being stored. Process 50 is then effected by cyclic multiply unit 88 applying the shift value for submatrix $P_{n,m}$, which is also determined by the code and the selected recursion path, for example as shown in equation (10d), and accumulating this shifted value with the current right-hand side values to update the values $R_{HS}$. As mentioned above, these values need not be stored in right-hand side value memory 88, because they are only used in the next solution pass.

In this manner, the remainder of the parity bits $c_p$ are determined by following at least one recursion path, for example as described above relative to equations (10c) through (10m). Also as described above, controller 100 can effect the recursive operations by following two recursion paths, in which case another instance of cyclic multiply unit 88 would be useful for parallel processing.

Upon completion of the recursion path or paths, parity bit memory 90 will contain the encoded parity bits for the information bits then stored in information bit vector memory 84. These values can then be readily combined (i.e., appended to one another), to form the systematic encoded code word c, which is forwarded by encoding function 11 (FIG. 1) to the next function in the data flow. The next information word to be encoded can then be received, and stored in information bit vector memory 84, and the operation of encoder 38 repeated.

While FIG. 6 illustrates a hardware implementation of encoder 38, it will of course be understood by those skilled in the art having reference to this specification that the encoding process according to the preferred embodiment of this invention may also readily be realized by way of a software program executed by a programmable processor such as a microprocessor or a digital signal processor. It is contemplated that such a software implementation may be readily be realized by those skilled in the art having reference to this specification, without undue experimentation.

As mentioned above, the encoding of digital data for communication according to this preferred embodiment provides numerous important advantages, including reduction of memory requirements for the LDPC code and the computations required for encoding. In addition, as evident from the above description regarding encoder 38 relative to FIG. 6, hardware and software realization of this encoding approach is greatly streamlined, resulting in an encoder that can be realized at relatively low cost, and that can provide excellent real-time encoding for high data rate communications.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as claimed.

What is claimed is:

1. A transceiver for communicating encoded signals, comprising:
    an encoder for encoding code words according to a low-density parity-check code, comprising:
        a matrix value memory for storing parameters associated with each of a plurality of macro matrix entries, the stored parameters comprising:
            information corresponding to a plurality of non-zero entries of a first parity portion of a parity check matrix corresponding to the low-density parity-check code, the non-zero entries of the first parity portion of the parity check matrix defining a recursion path in the parity check matrix;

information corresponding to a non-zero entry of a factored parity block column of a factored version of the parity check matrix, the entry corresponding to an invertible cyclic submatrix, the entry aligned with a zero-valued selected block row of the first parity portion of the parity check matrix, as factored;

circuitry for resolving parity bits corresponding to the factored parity block column using information bits of an information bit vector and using the invertible cyclic submatrix, and for then recursively solving the parity bits for the remainder of the parity portion of the parity check matrix to derive code words corresponding to the information bit vector and its associated parity bits, said resolving circuitry comprising:

a cyclic multiply unit, coupled to the matrix value memory; and a shifter for circularly shifting a selected portion of the information bit vector according to a shift value for an entry;

a right-hand side value memory, coupled to the cyclic multiply unit, for storing product values;

an exclusive-OR function for performing a bitwise exclusive-OR operation on the output of the shifter and the product values;

a controller for controlling the operation of the cyclic multiply unit and accessing of the matrix value memory;

a modulator, for modulating signals corresponding to the code words;

digital-to-analog converter circuitry, for generating an analog signal corresponding to the modulated signals; and transmitter circuitry, for transmitting the analog signal over a communications facility.

2. The transceiver of claim 1, wherein the information corresponding to the non-zero entry of the factored parity block matrix comprises a weight value indicating the number of shifted diagonals contained within that entry, and shift values indicating the position of the shifted diagonals.

3. The transceiver of claim 1, wherein the parameters further comprise:

information corresponding to the selected block row of the information portion of the parity check matrix, as factored.

4. The transceiver of claim 1, wherein the matrix value memory comprises controller logic arranged according to the information corresponding to a non-zero entry of a factored parity block column of a factored version of the parity check matrix.

5. The transceiver of claim 1, wherein the encoder further comprises:

a parity memory, coupled to the resolving circuitry, for storing parity bits for the code word.

6. The transceiver of claim 1 wherein the resolving circuitry is implemented in programmable logic circuitry; and further comprising program memory for storing instructions that are executable by the programmable logic circuitry.

7. The transceiver of claim 1, wherein the stored information corresponding to non-zero entries of the first parity portion of the parity check matrix comprises, for each entry, a shift value indicating a position of a cyclically shifted diagonal of a submatrix represented by the entry.

8. The transceiver of claim 1, wherein the cyclic multiply unit further comprises:

an accumulator, for storing shifter result values.

9. The transceiver of claim 1, wherein the recursion path is defined by each block row of the first parity portion having a block row weight not greater than two, with at least one block row of the first parity portion having a block row weight of one, and by each block column of the first parity portion having a column weight not greater than two.

10. An encoder for generating a code word according to a low-density parity check code, comprising:

a matrix value memory for storing parameters associated with each of a plurality of macro matrix entries, the stored parameters comprising:

information corresponding to a plurality of non-zero entries of a first parity portion of a parity check matrix corresponding to the low-density parity-check code, the non-zero entries of the first parity portion of the parity check matrix defining a recursion path in the parity check matrix;

information corresponding to a non-zero entry of a factored parity block column of a factored version of the parity check matrix, the entry corresponding to an invertible cyclic submatrix, the entry aligned with a zero-valued selected block row of the first parity portion of the parity check matrix, as factored;

circuitry for resolving parity bits corresponding to the factored parity block column using information bits of an information bit vector and the invertible cyclic submatrix, and for then recursively solving the parity bits for the remainder of the parity portion of the parity check matrix to derive code words corresponding to the information bit vector and its associated parity bits, said resolving circuitry comprising:

a cyclic multiply unit, coupled to the matrix value memory, and a shifter for circularly shifting a selected portion of the information bit vector:

an exclusive-OR function for performing a bitwise exclusive-OR operation on the output of the shifter and right-hand side product values; and a controller for controlling the operation of the cyclic multiply unit and accessing of the matrix value memory.

11. The encoder of claim 10, wherein the information corresponding to the non-zero entry of the factored parity block matrix comprises a weight value indicating the number of shifted diagonals contained within that entry, and shift values indicating the position of the shifted diagonals.

12. The encoder of claim 10, wherein the parameters further comprise:

information corresponding to the selected block row of the information portion of the parity check matrix, as factored.

13. The encoder of claim 10, wherein the matrix value memory comprises controller logic arranged according to the information corresponding to a non-zero entry of a factored parity block column of a factored version of the parity check matrix.

14. The encoder of claim 10, further comprising:

a parity memory, coupled to the resolving circuitry, for storing parity bits for the code word.

15. The encoder of claim 10, wherein the resolving circuitry comprises:

programmable logic circuitry; and program memory for storing instructions that are executable by the programmable logic circuitry.

16. The encoder of claim 10, wherein the cyclic multiply unit further comprises:

an accumulator, for storing shifter result values.

17. The encoder of claim 10, further comprising:

a right-hand side value memory, coupled to the cyclic multiply unit, for storing right-hand side product values.

18. The encoder of claim 10, wherein the recursion path is defined by each block row of the first parity portion having a block row weight not greater than two, with at least one block row of the first parity portion having a block row weight of one, and by each block column of the first parity portion having a column weight not greater than two.

* * * * *